(12) United States Patent
Tanner

(10) Patent No.: US 6,578,180 B2
(45) Date of Patent: Jun. 10, 2003

(54) METHOD AND SYSTEM FOR TESTING INTERCONNECTED INTEGRATED CIRCUITS

(75) Inventor: Howard Carl Tanner, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 09/726,287

(22) Filed: Nov. 30, 2000

(65) Prior Publication Data

US 2002/0066062 A1 May 30, 2002

(51) Int. Cl.[7] .............................................. G06F 17/50
(52) U.S. Cl. ................................ 716/4; 716/5; 714/724; 714/734; 714/742
(58) Field of Search ........................ 716/1–21; 324/765; 365/226; 370/249; 438/18; 703/16; 714/724, 738, 740

(56) References Cited

U.S. PATENT DOCUMENTS 5,103,450 A * 4/1992 Whetsel ...................... 714/724

* cited by examiner

Primary Examiner—Vuthe Siek
Assistant Examiner—Helen B Rossoshek

(74) Attorney, Agent, or Firm—Joseph P. Lally; Mark E. McBurney

(57) ABSTRACT

A system, device, and method for dynamically testing integrated circuits is disclosed. The system includes a first integrated circuit including input pins, output pins, normal operating logic, and control logic. The control logic is connectable to the input pins and configured to initiate a test interval based on a state of the input pins and to record the state of the input pins during the test interval. A second integrated circuit of the system includes input pins, output pins, normal operating logic, and test control logic. The control logic connectable to the output pins and configured to generate a user programmable set of test output signals. At least some of the output pins of the second integrated circuit are connected to at least some of the input pins of the first integrated circuit. The test control logic of the first integrated may be configured to initiate the test interval when the state of the input pins matches a predefined state. A portion of the test control logic of the first and second devices may be driven by a system clock that drives the operating logic such that the test output signals of the second device and the test input signals of the first device transition at the frequency of the system clock during the test interval. The test output signals may transition among one of a set of possible test output states, wherein the possible test output states include a predetermined pattern, an inverse of the predetermined pattern, an all 0's pattern, and an all 1's pattern.

19 Claims, 5 Drawing Sheets

METHOD AND SYSTEM FOR TESTING INTERCONNECTED INTEGRATED CIRCUITS

BACKGROUND

1. Field of the Present Invention

The present invention generally relates to the field of data processing systems and more particularly to an electronic system enabled for dynamic test verification of interconnections among various devices such as integrated circuits on a printed circuit board.

2. History of Related Art

A printed circuit board of any significant complexity may include a large number of integrated circuits, each of which has many input/output signals. In addition, an electronic system may include multiple interconnected circuit boards, each of which has its own set of integrated circuits. As the number of integrated circuits increases and the number of signals per integrated circuit increases, the number of interconnecting signals increases dramatically. With a very large number of signals propagating between the various integrated circuits, the task of testing a printed circuit board for proper interconnections among the various integrated circuits becomes exceedingly complex. Typically, verification of the interconnections is achieved using complex and expensive test machinery that is capable of driving a large number of inputs at high speed with a predetermined pattern or sequence of patterns while simultaneously monitoring a large number of output signals. When test equipment of this type is not available, existing methods such as conventional boundary scan methods provide an economical procedure for checking various functions of the system. Boundary scan methods, however, typically implement some form of serial communication bus operating at a clock speed that is significantly slower than the clock speed at which the system will ultimately operate. Thus, conventional boundary scan methods are suitable for testing gross functionality of a system or device under relaxed timing conditions. Because, however, various system characteristics, such as stray capacitance, may not exhibit themselves at relaxed timing conditions, it would be highly desirable to expand the testing enabled by conventional boundary scan techniques to encompass clock speeds that the system and its components will experience in the field.

SUMMARY OF THE INVENTION

The problems identified above are addressed by a system, device, and method for dynamically testing integrated circuits. The system includes a first integrated circuit including input pins, output pins, normal operating logic, and control logic. The control logic is connectable to the input pins and configured to initiate a test interval based on a state of the input pins and to record the state of the input pins during the test interval. A second integrated circuit of the system includes input pins, output pins, normal operating logic, and test control logic. The control logic connectable to the output pins and configured to generate a user programmable set of test output signals. At least some of the output pins of the second integrated circuit are connected to at least some of the input pins of the first integrated circuit. The test control logic of the first integrated may be configured to initiate the test interval when the state of the input pins matches a predefined state. A portion of the test control logic of the first and second devices may be driven by a system clock that drives the operating logic such that the test output signals of the second device and the test input signals of the first device transition at the frequency of the system clock during the test interval. The test output signals may transition among one of a set of possible test output states, wherein the possible test output states include a predetermined pattern, an inverse of the predetermined pattern, an all 0's pattern, and an all 1's pattern.

BRIEF DESCRIPTION OF THE DRAWINGS

Other objects and advantages of the invention will become apparent upon reading the following detailed description and upon reference to the accompanying drawings in which.

Figure 1:
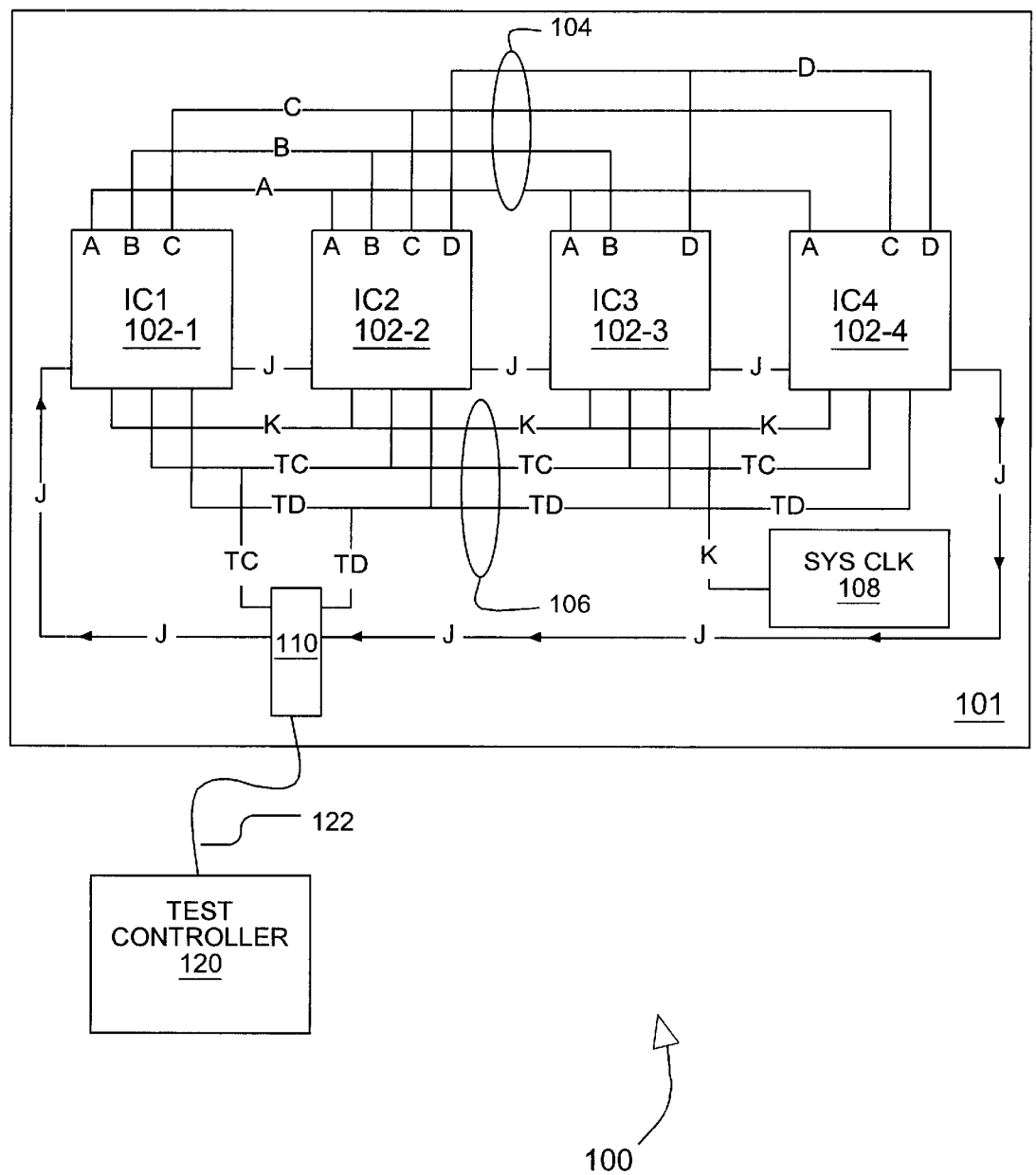
FIG. 1 is a block diagram of an electronic system comprised of a set of integrated circuits implemented according to one embodiment of the invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1 is a block diagram of an electronic system 100 according to one embodiment of the invention. In the depicted embodiment, system 100 includes a circuit board 101 suitable for use in a data processing system such as a microprocessor-based computer. Circuit board 101 may comprise, for example, the motherboard of a desktop computer, an adapter card suitable for connecting to a peripheral bus of the data processing system, or any other circuit board suitable for use in a data processing system. The depicted embodiment of printed circuit board 101 includes a set of integrated circuits 102-1, 102-2, 102-3, and 102-4 (generically or collectively referred to herein as integrated circuit(s) 102). Integrated circuits 102 communicate information among each other via various signals collectively identified in FIG. 1 by reference numeral 104 to accomplish system functions under normal operating conditions. Signals 104 may include address signals, data signals, and control signals. As illustrated in FIG. 1, each of the signals 104 may be provided to all integrated circuits 102 on printed circuit board 101 or to a subset of integrated circuits 102. By way of illustration using the depicted embodiment, signal A is provided to each integrated circuit 102, signal B is provided to integrated circuit 102-1, 102-2, 102-3, but not 102-4, signal C is provided to integrated circuits 102-1, 102-2, and 102-4, while signal D is provided to integrated circuits 102-2, 102-3, and 102-4.

Although the depicted embodiment of printed circuit board 101 illustrates only four integrated circuits 102 and a set 104 of only four signals, those familiar with data processing system design will appreciate that, typically, a printed circuit board of any significant complexity may include a much larger number of integrated circuits, each of which has a great number of input/output signals. Moreover, the system 100 contemplated by the present invention may include multiple interconnected circuit boards, each of which has its own set of integrated circuits. As the number of integrated circuits increases and the number of signals per integrated circuit increases, the number of interconnecting signals increases dramatically. With a very large number of signals propagating between the various integrated circuits 102, the task of testing a printed circuit board for proper interconnections among the various integrated circuits 102 becomes exceedingly complex. Typically, verification of the interconnections among the various integrated circuits is achieved using complex and expensive test machinery that is typically capable of driving a large number of inputs at high speed with a predetermined pattern or sequence of patterns while simultaneously monitoring a large number of output signals.

The invention contemplates an economical method and system for enabling dynamic testing of electronic system 100. The test method builds on the concept of boundary scan testing in which test patterns are applied to the integrated circuits of an electronic system via a relatively simple communication bus such as a JTAG compliant bus or an I$^2$C bus. The present invention extends the testing capabilities of these techniques by enabling the testing of a dynamic sequence of patterns that are executed at a clock speed that system 100 and its integrated circuits 102 will experience in the field.

Referring to FIG. 1, a test controller 120 is connected to system 100 via a connector 110 on circuit board 101. Test controller 120 is enabled to communicate information to (and receive information from) integrated circuits 102 of system 100 via a cable 122. Typically, cable 122 communicates information between system 100 and controller 122 according to a pre-selected communication bus protocol. In the depicted embodiment, an I$^2$C protocol is illustrated as the protocol by which controller 120 communicates with system 100. The I$^2$C bus is a simple, two-line bus for interconnecting a variety of devices. Information is transferred over an I$^2$C bus via using a clock signal (identified in FIG. 1 as the test clock (TC) signal) and a data signal (identified in FIG. 2 as the test data (TD) signal. For detailed information regarding the I$^2$C bus, the reader is referred to the I$^2$C Bus Specification, Version 2.0, December 1998 from Phillips Semiconductors B.V. (www.semiconductors.phillips.com) P.O. Box 218, 5600 MD Eindhoven, The Netherlands, and to Paret et al., The I$^2$C Bus From Theory To Practice (John Wiley & Son Ltd. 1997), ISBN No. 0471962686, both incorporated by reference herein.

In another embodiment, controller 120 and integrated circuits 102 communicate via a serial bus (identified in FIG. 1 by the reference letter "J") that is compliant with IEEE 1149.1 Specification entitled "IEEE Test Port and boundary Scan Architecture" (commonly referred to as "the JTAG standard" or simply "JTAG"), which is incorporated by reference herein. In this embodiment, controller 120 includes JTAG control logic for providing JTAG compliant signals to system 100. In addition, each integrated circuit 102 complies with JTAG. Those familiar with the JTAG standard will appreciate that a JTAG compliant device includes a register referred to as a boundary scan register (BSR) that is suitably coupled to the JTAG serial bus. The BSR conveys information about internal components of the device such as the status of an internal register. Information stored in the internal register is stored in the BSR. By appropriate control of the JTAG compliant signals, test controller 120 can read and write to internal nodes of integrated circuit 120.

System 100 further includes a system clock generator 108 that generates a system clock signal identified in FIG. 1 by the reference letter "K." The system clock K provides a synchronous clock to each of the integrated circuits 102 of system 100. Typically, each of the signals 104 of system 100 is launched or received relative to a transition of system clock K.

Controller 120 may be a general-purpose processor or a specialized unit. In one embodiment, the controller 120 may comprise a service processor attached to circuit board 101, in which case the cable 122 and connector 110 would be eliminated. Controller 120 is configured to execute a test program and to communicate with the integrated circuits 102 of system 100. In an embodiment in which controller 120 communicates with integrated circuits 102 via an I$^2$C protocol, for example, controller 120 acts as a bus master that is capable of addressing each of the integrated circuits 102 via the test data signal TD. Each integrated circuit 102 responds to a unique I$^2$C address generated by controller 120. Regardless of the specific protocol by which controller 120 communicates with integrated circuits 102, the protocol is typically slow and well trusted relative to the rate of the system clock K.

Figure 2:
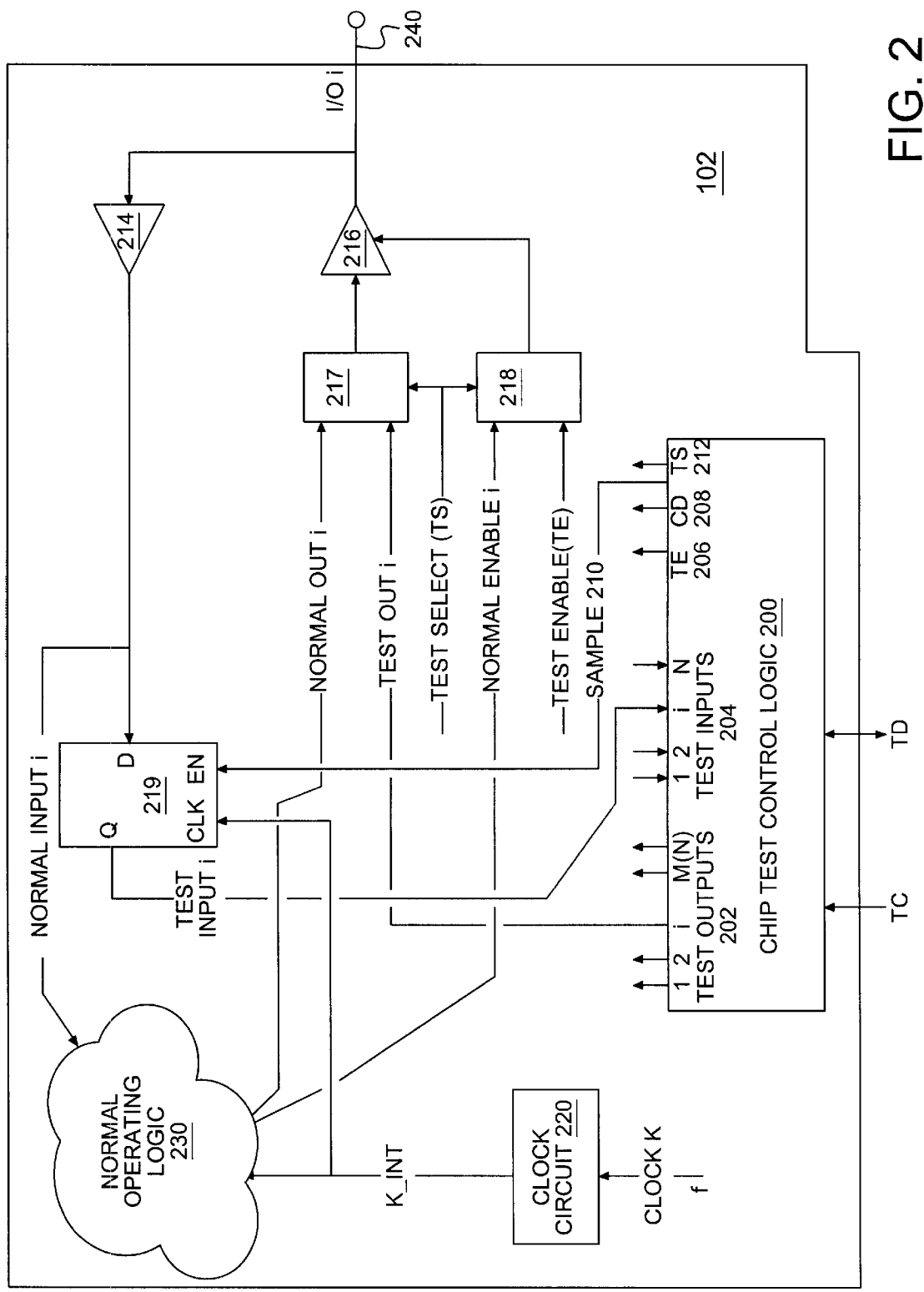
FIG. 2 is a block diagram illustrating greater detail of an embodiment of the test logic in at least some of the integrated circuits of FIG. 1.

Turning now to FIG. 2, additional detail of an integrated circuit 102 of system 100 including one embodiment of the circuitry incorporated into each integrated circuit 102 in accordance with the present invention is depicted. Each integrated circuit 102 includes test control logic 200 that communicates with test controller 120 (FIG. 1) via a relatively slow and trusted communication protocol. In the depicted embodiment, this communication occurs via the test clock TC and the test data TD signals of an I$^2$C bus or via a JTAG compliant serial bus. The system clock K is connected to a clock circuit 220, such as a phase locked loop (PLL), clocking tree, or other suitable clock circuit, and produces one or more copies of an internal clock K_INT. Internal clock K_INT is routed to the normal operating logic 230 of integrated circuit 102. Normal operating logic 230 is configured to perform a predetermined function independent of the dynamic testing circuitry described herein.

Integrated circuit 102 receives a set of N input signals via a corresponding set of input pins or I/O pins 240 (only one of which is shown in FIG. 2) and generates a set of M output signals via a corresponding set of output pins or I/O pins 240. The input and output signals represent the signals 104 indicated in FIG. 1 that are communicated among the integrated circuits 102 of system 100. While some of the signals are input only signals and some are output only signals, FIG. 2 illustrates features of the present invention with respect to a single input/output signal I/O i that is connected to an I/O pin 240. Each of the N input signals (including I/O i) is connected to a separate receiver 214 (one of which is shown in FIG. 2). Each receiver 214 connects its corresponding input signal to normal operating logic 230 of integrated circuit 102 and to a sample-and-hold latch 219 that interfaces the input signal to test control logic 200. In this arrangement, test control logic 200 receives a set of N test input signals identified in FIG. 2 by reference numeral 204. The system clock K_INT that drives the normal operating logic 230 also drives sample-and-hold latches 219. Thus, each test input signal 204 received by test control logic 200 from latch 219 is substantially identical to the corresponding input signal that is routed to normal operating logic 230.

The normal operating logic 230 is configured to generate a set of M normal output signals. Test control logic 200 is configured to generate a set of M test output signals identified in FIG. 2 by reference numeral 202. Each normal output signal and its corresponding test output signal 202 are routed to the inputs of a separate signal multiplexer 217 (one of which is depicted in FIG. 2). The output of multiplexer 217 is connected to a suitable output driver 216 that is connected to a corresponding output pin 240 of integrated circuit 102. A test select (TS) signal 212 generated by test control logic 200 provides the select input to each signal multiplexer 217. The normal output signal is selected when integrated circuit 102 is in normal operating mode. The test output signal is selected when integrated circuit 102 is in a test mode and is designated as a transmitting device (via appropriate programming from test controller 120). In the depicted embodiment, output driver 216 includes an enable signal. The enable signal to output driver 216 is driven by the output of an enable multiplexer 218. Enable multiplexer 218 receives a normal enable signal from normal operating logic 230 and a test enable (TE) signal generated by test control logic 200. Typically, bidirectional pins (i.e., I/O pins) of integrated circuit 102 are connected to an output driver (such as output driver 216 depicted in FIG. 2) that is enabled with a separate enable signal. The enable signal is used to prevent the output driver from competing with the state of an input bit when the I/O pin is functioning as an input pin. In this case, the output driver for each I/O pin of integrated circuit 102 is enabled by an enable signal that is output from one of the enable multiplexers 218. Each enable multiplexer 218 receives a "normal" output enable signal from normal operating logic 230 and a test output enable signal. The test output enable signal is generated by test control logic 200 when the corresponding integrated circuit 102 is in a test mode and is designated as a transmitting device. The test select signal TS generated by test control logic 200 provides the select input to signal multiplexer 217 and enable multiplexer 218. It will be appreciated that the test logic of FIGS. 2, 3, and 4 is substantially the same for each IC 102-1, 102-2, 102-3, and so forth except that the N and M parameters may differ from chip to chip.

Figure 3:
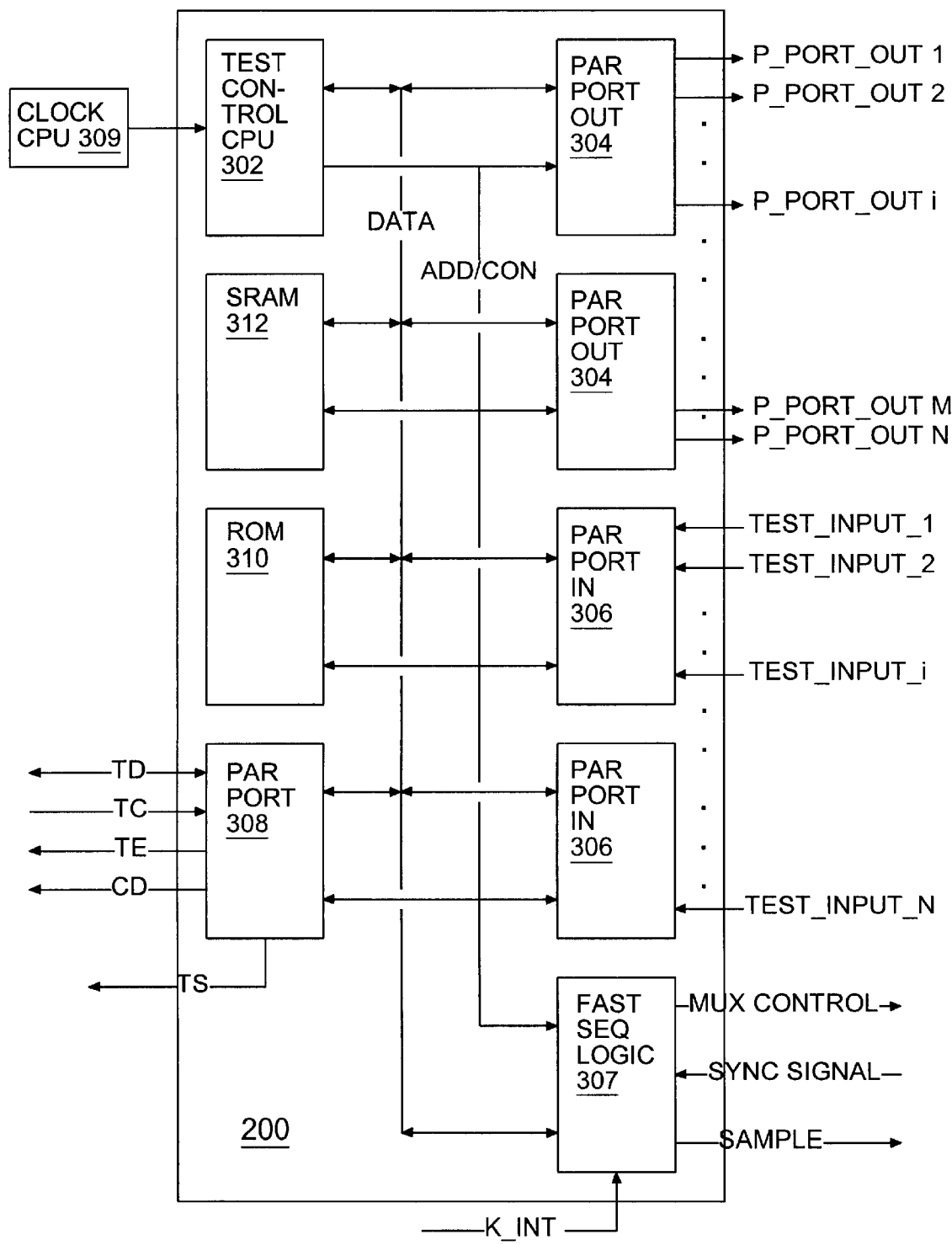
FIG. 3 illustrates an exemplary design for chip the test control logic of FIG. 2.

Turning now to FIG. 3, a suitable implementation of the test control logic 200 depicted in FIG. 2 is illustrated in block diagram format. Generally speaking, test control logic 200 is connectable (through sample-and-hold latches 219) to the inputs pins of IC 102 and is suitable for initiating a test mode or test interval based on a state of the input pins. Test control logic 200 is enabled to record in a storage device the state or sequence of states of the input pins 240 during the test interval.

In the illustrated embodiment, test control logic 200 is driven by a general purpose central processing unit macro cell (CPU) 302 such as a PowerPC® 401 processor cell from IBM Corporation. (In other embodiments, test control logic 200 may be implemented entirely with combinatorial and sequential logic). CPU 302 is configured to execute a set of instructions (software) stored in non-volatile memory device (ROM) 310 to provide functional control of test control logic 200. ROM 310 may be implemented as flash memory cells, EEPROM devices, or other suitable non-volatile memory technology. In addition, a relatively small static RAM 312 is provided for temporary storage of data and variables.

As depicted in FIG. 2 and FIG. 3, test control logic 200 further includes a set of N parallel port input bits 306 that receive the set of test inputs signals 204 (identified in FIG. 2). Each of the parallel port input bits 306 is connectable to a corresponding input pin of IC 102. In the depicted embodiment, each input pin (or I/O pin) 240 is connectable to a corresponding parallel port input bit through 306 through a driver 214 and a sample-and-hold latch 219. Parallel port input bits 306 enable test control logic 200 to capture data received by integrated circuit 102.

Test control logic 200 further includes a set of parallel port output bits identified in FIG. 3 by reference numeral 304 that are connected to and controlled by CPU 302. The number of parallel port output bits 304 is preferably at least as great as the number (N) of test outputs 202 generated by test control logic 200. In one embodiment, parallel port output bits 304 double as masking bits when the integrated circuit 102 is in receive mode as explained in greater detail below. In this embodiment, the number of parallel port output bits 304 is the greater of the number (N) of test outputs signals 202 or the number (M) of test inputs signals 204. Parallel port output bits 304 are programmed by test controller 120 of FIG. 1 via CPU 302 to store a pattern that the programmer desires to transmit from an integrated circuit 102 when the integrated circuit is designated as a transmitting IC. Each of the M parallel port output bits 304 is connected to one of the M signal multiplexers 217, one of which is shown in FIG. 2. When integrated circuit 102 is placed in a test mode, a test select signal TS selects the set of test outputs 202 that are driven onto the corresponding output pins of integrated circuit 102.

Figure 4A:
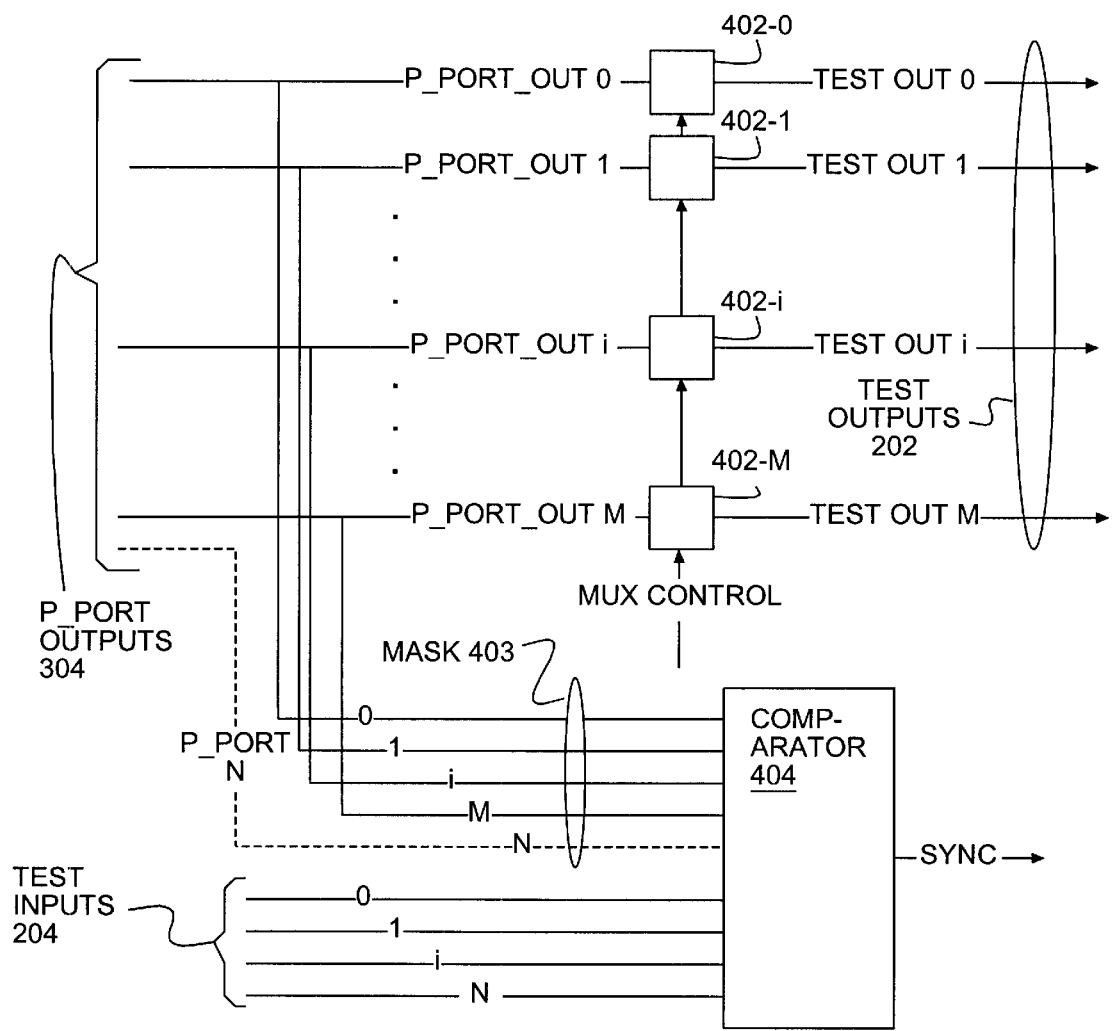
FIG. 4A depicts selected features of the chip test control logic of FIG. 3 including portions of fast sequential control logic.

In the depicted embodiment, each of the parallel port output bits 304 also provides an input to a comparator 404 shown in FIG. 4A. In this embodiment, the parallel port output bits 304 may be used to program a synchronization state. If the input pins 240 of an IC 102 designated as a receiving device match the synchronization state, test control logic 200 may initiate the test interval during which the state of the input pins 240 are recorded. The parallel port output bits may also double as a mask that is used when integrated circuit 102 is in receive mode to indicate which input signals are ignored when searching for the synchronization pattern. (For this reason, the actual number of bits in ports 304 must be the grater of N or M for the particular integrated circuit). In other embodiments, a separate port may be included to provide the mask pattern against which the input signals are compared. Separate ports might be provided at the cost of additional circuitry to enable an integrated circuit 102 to transmit and receive data simultaneously during testing of the device.

The depicted embodiment of test control logic 200 also includes a parallel port 308 that enables CPU 302 to communicate with test controller 120. The communication between CPU 302 and test controller 120 is typically facilitated by software stored in ROM 310. In the depicted embodiment, for example, the software may periodically sample the test clock signal TC and the test data signal TD. In addition, the software is typically configured to drive data on the TD signal when required by the communication protocol. The parallel port 308 depicted in FIG. 3 provides interface signals to integrated circuit 102 including the test select signal TS described previously, a chip disable signal CD 208, and a test enable signal TE 206. The test select signal TS causes the signal mulitplexers 217 (and the enable multiplexers 218) to pass test data to the corresponding output pins of integrated circuit 102. The test enable signal TE provides, as its name implies, an enable signal for any output driver that requires enabling when test data is to be passed to the corresponding output pin of integrated circuit 102. The chip disable (CD) signal generated by test control logic 200, when asserted, causes the normal operating logic 230 of integrated circuit 102 to enter a non-operational or reset state so that the operating logic 230 does not interfere with the test mode.

Test control logic 200 further includes fast sequential control circuitry 307 that is connected to CPU 302. Typically, CPU 302 sets up the fast sequential control circuit 307 using commands operating at a first clock rate, which is typically controlled by the clock rate (309) of CPU 302. After proper setup, control circuitry 307 is clocked or driven by the clock signal K (or K_INT) that drives normal operating logic 230. Fast sequential control circuitry 307 is responsible for generating a set of MUX CONTROL signals that control the patterns that are driven onto the set of test output signals 202 when the corresponding integrated circuit 102 is transmitting information (i.e., is in transmit mode). Thus, the test output signals 204 of a transmitting device transition at the frequency of the system clock (K) during the test interval.

Figure 4B:
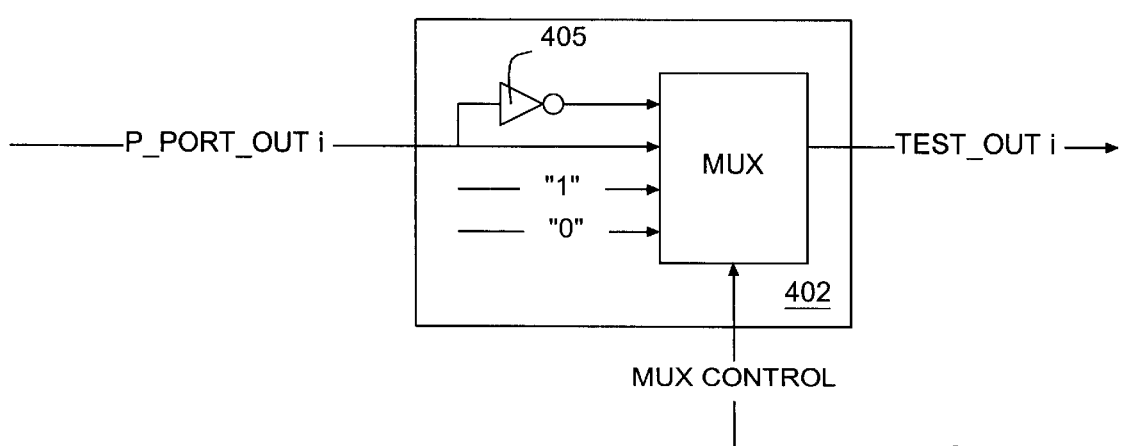
FIG. 4B depicts an embodiment of the multiplexer of FIG. 4A.

The MUX CONTROL signals, as explained in greater detail in connection with FIG. 4B below, function to control the operation of a group of output mulitplexers so that during transmit operations, the desired sequence of test patterns may be applied to the transmitting devices' output pins. Fast sequential control circuitry 307 is also for generating a SAMPLE signal that enables and disables sample-and-hold latches 219 (FIG. 2) when the integrated circuit 102 is receiving information.

In one embodiment, fast sequential control circuitry 307 accepts commands from test controller 120 via CPU 302 to define a predetermined order of output states that will be generated by integrated circuit 102 when integrated circuit 102 is designated as a transmitting device. In one embodiment, test control logic 200 is configured to produce four different output states. These four output states may include an all 0's output state, an all 1's output state, a test pattern output state TP, and an inverse of the test pattern (!TP). Typically, one of the output patterns test control logic 200 produces is designated as a synchronization (SYNC) pattern that triggers high speed operation of fast sequential control logic 307 on an integrated circuit 102 that is designated as a receiving device. (For purposes of this disclosure, the SYNC pattern is assumed to be the all 0's pattern although any of the patterns may be designated as the SYNC pattern). Each of these patterns refers to the pattern of bits stored in the parallel port output bits 304 (FIG. 3). The pattern is ultimately driven onto the output pins (or I/O pins) 240 of integrated circuit 102 when the integrated circuit 102 is designated to be a transmitting integrated circuit. A programmer of test controller 120 determines the order of the set of patterns that are to be generated by the transmitting integrated circuit 102. Typically, one of the four patterns must be the sync pattern. The CPU 302 of the integrated circuit 102 designated as the transmitting integrated circuit interprets these commands and sends input/output commands to fast sequential logic block 307 to store the pattern to be sent in each of the four time slots.

During operation, fast sequential control circuitry 307 continuously changes the MUX CONTROL signal at each edge of the system clock K (or K_INT) in accordance with the predetermined order to produce the desired sequence of output signals on the output pins 240 of integrated circuit 102 until the integrated circuit is no longer designated as the transmitting integrated circuit. Referring to FIGS. 4A and 4B, the MUX CONTROL signal drives the select inputs of a set of 4:1 multiplexers identified by reference numerals 402-0, 402-1, . . . 402-i, . . . , 402-N (generically or collectively referred to herein as multiplexer(s) 402). Each 4:1 multiplexer 402 receives one of the parallel port output bits 304 as one of its inputs. In the depicted embodiment, each 4:1 multiplexer 402 includes an inverter 405 that produces the inverse of the corresponding parallel port output bit 304. In addition, each multiplexer 402 also receives a logical "0" as one of its inputs and a logical "1" as another. The implementation of one multiplexer 402 is shown in greater detail in FIG. 4B. In this arrangement, the outputs of multiplexers 402 are able to generate a test pattern (P) comprised of the bits stored in parallel port output bits 304, the inverse of the test pattern (!P), an all 0's pattern, and an all 1's pattern. The outputs of the 4:1 multiplexers 402 form the set of test outputs 202 generated by test control logic 200. Using this test pattern generation mechanism, the invention is capable of producing a sequence of output patterns such as: a SYNC pattern, a line pre-conditioning pattern, a test pattern, and a post-conditioning pattern. This sequence of output patterns changes at the rate of system clock K. These four patterns can be manipulated to simulate worst-case switching scenarios in which the output signal transitions from one clock cycle to the next are maximized. As an example, the all 0's pattern may comprise the SYNC pattern, the !P pattern may comprise the line pre-conditioning pattern, the P pattern may comprise the test pattern, and the all 1's pattern may comprise the post-conditioning pattern. Thus, test control logic 200 is configured to enable test controller 120 to determine a sequence of test patterns. Test control logic 200 applies the determined sequence of patterns at clock speed to the output pins of the corresponding integrated circuit 102 when the integrated circuit is designated as a transmitting device.

Fast sequential control circuit 307 further includes logic for controlling a SAMPLE signal. The SAMPLE signal defines a test interval during which the test control logic 200 of a designated receiving integrated circuit 102 is enabled to record or capture the state of its input signals. The SAMPLE signal may be asserted at a precise moment in time after test control logic 200 detects a synchronization pattern on its input pins.

When an integrated circuit 102 is placed into receive and check mode by transmitting proper instructions from test controller 120 to the CPU 302 of the targeted integrated circuit 102, ROM 310 sends a sequence of instructions to fast sequential control circuitry 307. In response to these instructions, control circuitry 307 causes an automatic capture sequence to begin. In this capture sequence, control logic 307 asserts the SAMPLE signal (which is connected to the enable input of sample-and-hold latch 219) thereby causing the pattern stored on the outputs of sample-and-hold latches 219 to change at the frequency of clock K_INT. When an integrated circuit 102 is designated as a receiving integrated circuit, the comparator 404 of the corresponding integrated circuit 102 is utilized. When the test inputs signals 204 received by the designated integrated circuit 102 match the predetermined SYNC pattern (ignoring any masked bits as described below), comparator 404 generates a SYNC signal that is received by fast sequential control circuitry 307.

In the depicted embodiment, mask bits 403 are provided by the set of test output signals 202. If a "1" is programmed in a test output bit 202 when the integrated circuit 102 is designated as a receiving device, the corresponding input signal 204 is ignored in determining whether an input data pattern matches the synchronization pattern. Mask bits are useful because all of the signals 104 generated by the integrated circuit 102 designated as the transmitting device may not be received by each integrated circuit 102 designated as a receiving device. The unconnected signals at a particular integrated circuit 102 must be ignored when searching for the synchronization pattern.

Figure 5:
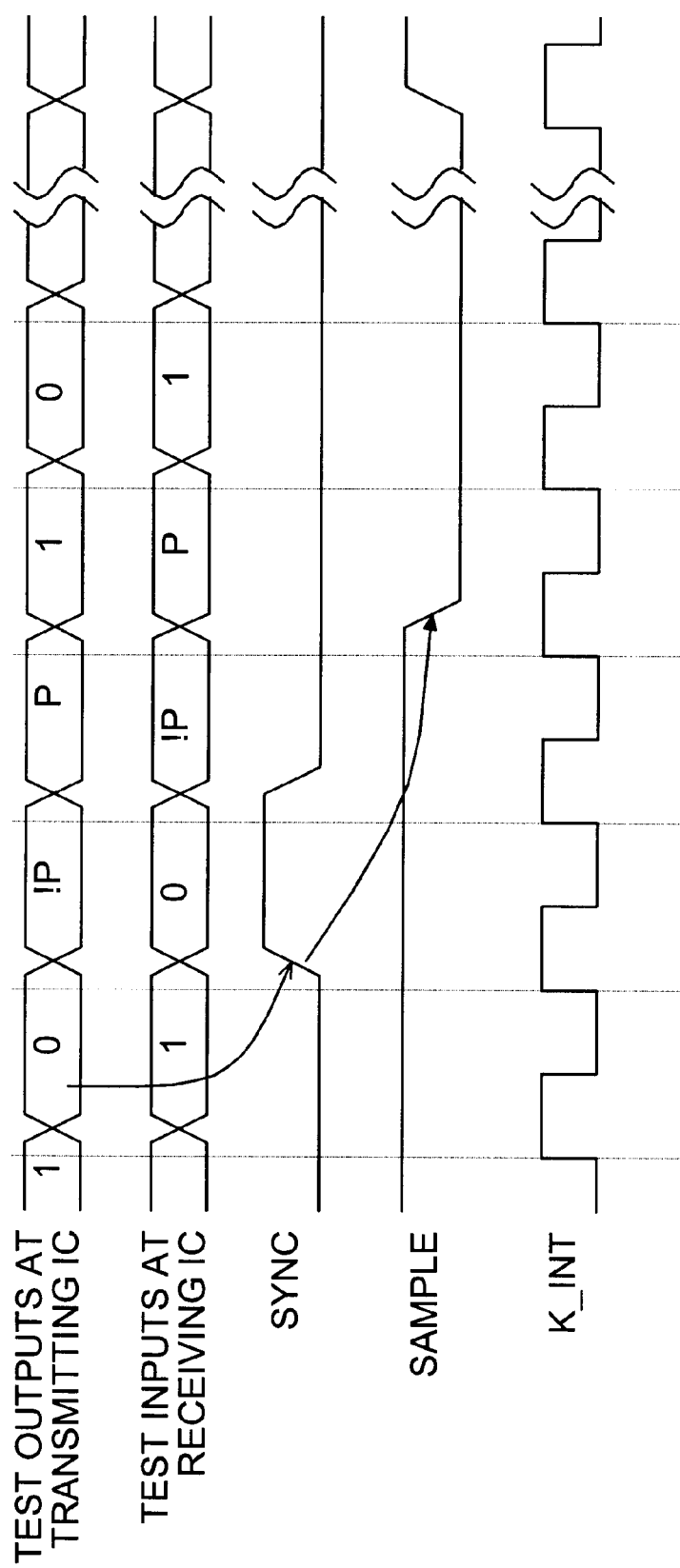
FIG. 5 is a timing diagram of selected signals illustrating a data capture sequence.

Referring to the timing diagram of FIG. 5, when comparator 404 of a receiving integrated circuit detects the synchronization pattern (the all 0's pattern in the depicted embodiment) on all unmasked test inputs 204, comparator 404 asserts the SYNC signal, which is fed back to fast sequential control circuitry 307. In response to detecting the asserted SYNC signal, fast sequential control circuitry 307 delays one clock interval and deactivates the SAMPLE signal. When the SAMPLE signal is deactivated, the pattern (data) present on the integrated circuit's input pins is latched and held in sample-and-hold latches 219 until CPU 302 commands fast sequential control circuitry 307 to start another automatic capture sequence (by reasserting the SAMPLE signal). The pattern that is present on the sample-and-hold latches 219 when the SAMPLE signal is deactivated can then be read in via parallel ports 306 and stored in SRAM 312 for subsequent comparison with a known good pattern. This comparison between the captured pattern and the known good pattern can be performed by CPU 302 at the slower clock speed (i.e., the analysis of the captured data need not be performed in real time). If, however, it is desirable to perform the comparison between captured data and a previously determined known good pattern, additional hardware can be incorporated into test control logic 200 to compare the captured pattern against the known good pattern.

Combining all of the features described above, operation of the test sequence may proceed as follows. Initially, the normal operating logic 230 of one or more of the integrated circuits is reset. Test controller 120 (via CPU 302) then designates one of the integrated circuits 102 as a transmitting device and stores a pattern in the parallel port output bits 304 of the designated transmitting device. In addition, the test controller can program the desired pattern sequence, which comprises the pattern of select inputs that are applied to each of the 4:1 multiplexers. Test controller 120 also designates one or more other integrated circuits 102 as receiving device(s) and programs the mask bits (using parallel port output bits 304 of each receiving device). The sample sequence described above is then initiated. When a designated receiving device detects the SYNC pattern on its non-masked bits, it captures and holds the data pattern that is present on its input bits two cycles after the SYNC pattern is present. The captured data is stored in the SRAM of test control logic 200 for further analysis and comparison to known good patterns. In this manner, dynamic testing of electronic system 100 is enabled.

It will be apparent to those skilled in the art having the benefit of this disclosure that the present invention contemplates a method and system for dynamically testing interconnections between various integrated circuits of an electronic system at the actual clock rate of the system. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. An integrated circuit, comprising:
   input pins and output pins;
   operating logic connectable to the input pins and the output pins and configured to perform a predetermined function; and
   test control logic including a general purpose microprocessor cell and storage means to contain instructions executable by the microprocessor cell, the test control logic connectable to the inputs pins and configured to initiate a test interval based on a state of the input pins and further configured to record in a storage device the state of the input pins during the test interval.

2. The integrated circuit of claim 1, wherein the test control logic is configured to initiate the test interval when the state of the input pins matches a predefined state.

3. The integrated circuit of claim 2, wherein the test control logic includes the storage means comprises a ROM containing the executable instructions.

4. The integrated circuit of claim 1, wherein the test control logic is connectable to a test controller and the test controller is enabled to program the test control logic via a communication bus protocol selected from the bus protocols including I²C and JTAG.

5. The integrated circuit of claim 1, wherein at least a portion of the test control logic is driven by a system clock that drives the operating logic such that the test output signals transition at the frequency of the system clock during the test interval.

6. The integrated circuit of claim 1, wherein the test control logic is configured to assert a chip disable (CD) signal during the test interval and wherein the operating logic is configured to receive the CD signal and to enter a reset state when the CD is asserted.

7. The integrated circuit of claim 1, wherein the test control logic is configured to generate a set of test output signals that are connectable to the output pins when the integrated circuit is designated as a transmitting device.

8. The integrated circuit of claim 7, wherein the test output signals transition at a clock frequency defined by a system clock of the integrated circuit.

9. The integrated circuit of claim 7, wherein the test output signals transition among a set of possible test states, wherein the possible test output states consists of a predetermined pattern, an inverse of the predetermined pattern, an all 0's pattern, and an all 1's pattern.

10. The integrated circuit of claim 1, wherein the test output signals provide a masking pattern when the integrated circuit is designated as a receiving device, wherein the masking pattern indicates input pins of the integrated circuit that are capable of initiating the test interval.

11. An electronic system, comprising:
    a first integrated circuit including input pins, output pins, operating logic connectable to the input pins and the output pins and configured to perform a predetermined function, and microprocessor-based test control logic connectable to the inputs pins and configured to initiate a test interval based on a state of the input pins and to record in a storage device the state of the input pins during the test interval; and
    a second integrated circuit including input pins, output pins, operating logic connectable to the input pins and the output pins and configured to perform a predetermined function,
    and microprocessor-based test control logic connectable to the output pins and configured to generate a user programmable set of test output signals;

wherein at least a portion of the output pins of the second integrated circuit are connected to at least a portion of the input pins of the first integrated circuit.

12. The system of claim 11, wherein the test control logic of the first integrated is configured to initiate the test interval when the state of the input pins matches a predefined state.

13. The system of claim 12, wherein the test control logic further includes storage means containing the executable instructions.

14. The system of claim 11, further comprising a test controller connectable to the test control logic of the first and second integrated circuits, wherein the test controller is configured to enable a user of the controller to program the predefined state of the first integrated circuit and the set of output signals generated by the second integrated circuit.

15. The system of claim 14, wherein the test controller communicates with the integrated circuits via a communication bus protocol selected from the protocols including I²C and JTAG.

16. The system of claim 11, wherein at least a portion of the test control logic of the first and second integrated circuits is driven by a system clock that drives the operating logic such that the test output signals of the second device and the test input signals of the first device transition at the frequency of the system clock during the test interval.

17. The system of claim 11, wherein the test control logic of the first device is configured to assert a chip disable (CD) signal during the test interval and wherein the operating logic is configured to receive the CD signal and to enter a reset state when the CD is asserted.

18. The system of claim 11, wherein the first and second integrated circuits are attached to a printed circuit board.

19. The system of claim 11, wherein the test output signals transition among one of a set of possible test output states, wherein the possible test output states include a predetermined pattern, an inverse of the predetermined pattern, an all 0's pattern, and an all 1's pattern.

* * * * *